United States Patent
Choi et al.

(10) Patent No.: US 11,699,775 B2
(45) Date of Patent: Jul. 11, 2023

(54) SEMICONDUCTOR LED AND METHOD OF MANUFACTURING THE SAME

(71) Applicant: SAMSUNG ELECTRONICS CO., LTD., Suwon-si (KR)

(72) Inventors: Junhee Choi, Seongnam-si (KR); Nakhyun Kim, Yongin-si (KR); Jinjoo Park, Yongin-si (KR); Joohun Han, Hwaseong-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 131 days.

(21) Appl. No.: 17/138,071

(22) Filed: Dec. 30, 2020

(65) Prior Publication Data

US 2021/0226092 A1   Jul. 22, 2021

(30) Foreign Application Priority Data

Jan. 22, 2020 (KR) .................. 10-2020-0008760
Jun. 17, 2020 (KR) .................. 10-2020-0073732

(51) Int. Cl.
*H01L 33/24* (2010.01)
*H01L 25/075* (2006.01)
*H01L 33/32* (2010.01)
*H01L 33/00* (2010.01)

(52) U.S. Cl.
CPC .......... *H01L 33/24* (2013.01); *H01L 25/0753* (2013.01); *H01L 33/32* (2013.01); *H01L 33/0075* (2013.01)

(58) Field of Classification Search
CPC ..... H01L 33/24; H01L 33/32; H01L 33/0075; H01L 25/0753
See application file for complete search history.

(56) References Cited

U.S. PATENT DOCUMENTS

| | | |
|---|---|---|
| 7,381,504 B2 | 6/2008 | Kawaguchi et al. |
| 8,441,018 B2 | 5/2013 | Lee et al. |
| 8,669,574 B2 | 3/2014 | Konsek et al. |
| 9,257,605 B2 | 2/2016 | Seo et al. |
| 9,484,492 B2 | 11/2016 | Bour et al. |
| 9,595,637 B2 | 3/2017 | Kum et al. |
| 9,601,659 B2 | 3/2017 | Bour et al. |
| 2005/0194598 A1 | 9/2005 | Kim et al. |

(Continued)

FOREIGN PATENT DOCUMENTS

| | | |
|---|---|---|
| KR | 10-2011-0014521 A | 2/2011 |
| KR | 10-1308203 B1 | 9/2013 |

(Continued)

OTHER PUBLICATIONS

Communication dated Jun. 16, 2021, from the European Patent Office in European Application No. 20217782.0.

(Continued)

*Primary Examiner* — Mark W Tornow
(74) *Attorney, Agent, or Firm* — Sughrue Mion, PLLC

(57) ABSTRACT

A semiconductor light emitting diode (LED) and a method of manufacturing the same are provided. The LED includes a first semiconductor layer; a plurality of active elements spaced apart on the first semiconductor layer and each having a width less than a width of the first semiconductor layer; and a second semiconductor layer disposed on the plurality of active elements.

23 Claims, 20 Drawing Sheets

(56) References Cited

U.S. PATENT DOCUMENTS

| | | | |
|---|---|---|---|
| 2007/0275624 A1 | 11/2007 | Kawaguchi et al. | |
| 2008/0157057 A1 | 7/2008 | Kim | |
| 2012/0161185 A1 | 6/2012 | Wang | |
| 2012/0223289 A1 | 9/2012 | Gwo et al. | |
| 2014/0286369 A1* | 9/2014 | Katz | H01L 33/24 372/45.012 |
| 2015/0037203 A1 | 2/2015 | Pan | |
| 2015/0325598 A1* | 11/2015 | Pfeuffer | H01L 27/1222 438/23 |
| 2016/0336487 A1 | 11/2016 | Wang | |
| 2018/0198020 A1 | 7/2018 | Lai et al. | |
| 2019/0115513 A1 | 4/2019 | Im et al. | |
| 2020/0259055 A1 | 8/2020 | Iguchi et al. | |
| 2021/0043457 A1 | 2/2021 | Noda et al. | |

FOREIGN PATENT DOCUMENTS

| | | |
|---|---|---|
| KR | 10-2015-0007641 A | 1/2015 |
| KR | 10-1666836 B1 | 10/2016 |
| WO | 2019/039238 A1 | 2/2019 |
| WO | 2019/053923 A1 | 3/2019 |

OTHER PUBLICATIONS

Min-Yann Hsieh et al., "InGaN-GaN Nanorod Light Emitting Arrays Fabricated by Silica Nanomasks", IEEE Journal Quantum Electronics, May 2008, vol. 44, No. 5, pp. 468-472 (5 pages total).
Hwang et al., "Development of InGaN-based red LED grown on (0001) polar surface," The Japan Society of Applied Physics, Applied Physics Express, vol. 7, No. 071003, 2014, Total 5 pages.
Nguyen et al., "High-Efficiency InGaN/GaN Dot-in-a-Wire Red Light-Emitting Diodes," IEEE Photonics Technology Letters, vol. 24, No. 4, Feb. 15, 2012, pp. 321-323.
Samuelson et al., "Gallium nitride nano-sized LEDs," SPIE, Newsroom, 10.1117/2.1201603.006385, 2016, Total 2 pages.
Glas, "Critical dimensions for the plastic relaxation of strained axial heterostructures in free-standing nanowires," The American Physical Society, Physical Review B, vol. 74, No. 121302(R), 2006, Total 4 pages.
Palczewska et al., "Paramagnetic defects in GaN," Materials Research Society Internet Journal, Nitride Semiconductor Research, vol. 3, No. 45, 1998, Total 3 pages.
Communication dated Oct. 1, 2021 issued by the European Patent Office in application No. 20217782.0.
Communication dated Dec. 22, 2022, issued by the European Patent Office in counterpart European Application No. 20217782.0.

* cited by examiner

SEMICONDUCTOR LED AND METHOD OF MANUFACTURING THE SAME

CROSS-REFERENCE TO RELATED APPLICATIONS

This application is based on and claims priority from Korean Patent Application Nos. 10-2020-0008760 and 10-2020-0073732, filed on Jan. 22, 2020 and Jun. 17, 2020, respectively, in the Korean Intellectual Property Office, the disclosures of which are incorporated herein in their entirety by reference.

BACKGROUND

1. Field

The disclosure relates to semiconductor light emitting diodes (LEDs) and methods of manufacturing the same.

2. Description of Related Art

Light emitting diodes (LEDs) are known as the next generation of light sources having advantages such as long life, low power consumption, fast response speed, and environmental friendliness compared to light sources of the related art, and are used in various products such as backlights of lighting devices and display devices. In particular, group III nitride-based LEDs including gallium nitride (GaN), aluminum gallium nitride (AlGaN), indium gallium nitride (InGaN), and indium aluminum gallium nitride (In-AlGaN) serve as semiconductor light emitting devices that output light.

SUMMARY

Provided are semiconductor LEDs with improved emission efficiency and methods of manufacturing the same.

Provided are semiconductor LEDs including an active layer having a large lattice mismatch and methods of manufacturing the same.

Additional aspects will be set forth in part in the description which follows and, in part, will be apparent from the description, or may be learned by practice of the presented embodiments of the disclosure.

According to an aspect of the disclosure, there is provided a light emitting diode (LED) comprising: a first semiconductor layer; a plurality of active elements disposed on the first semiconductor layer, each of the plurality of active elements spaced apart from each other and having a width less than a width of the first semiconductor layer; and a second semiconductor layer disposed on the plurality of active elements.

Each of the plurality of active elements may have a first end in contact with the first semiconductor layer and a second end in contact with the second semiconductor layer.

The plurality of active elements may be arranged in a direction parallel to a width direction of the first semiconductor layer.

A sum of widths of the plurality of active elements may be less than a width of the first semiconductor layer.

Each of the plurality of active elements may be in a strain state.

A width of each of the plurality of active elements may be greater than or equal to about 10 nm and less than or equal to about 100 nm.

A pitch between the plurality of active elements may be greater than or equal to about 20 nm and less than or equal to about 300 nm.

The first semiconductor layer may comprise: a plurality of first semiconductor elements respectively in contact with the plurality of active elements, the plurality of first semiconductor elements being spaced apart from each other; and a first semiconductor common layer in contact with each of the plurality of first semiconductor elements.

The plurality of first semiconductor elements and the first semiconductor common layer may be made of the same material.

The second semiconductor layer may comprise a plurality of second semiconductor elements respectively in contact with the plurality of active elements, the plurality of second semiconductor elements being spaced apart from each other.

The second semiconductor layer may further comprise a second semiconductor common layer in contact with each of the plurality of second semiconductor elements.

The LED may further comprising: an insulating layer disposed between the plurality of active elements.

The insulating layer comprises a mesh structure.

Each of the plurality of active elements may comprise $In_xGa_{1-x}N$ ($0 \leq x \leq 1$).

A content of In of each of the plurality of active elements may be about 35% or more.

Each of the plurality of active elements may emit red light.

According to another aspect of the disclosure, there is provided a display device comprising: a substrate; a display element layer disposed on the substrate and comprising a plurality of light emitting diodes (LEDs); and a driving element layer comprising a plurality of transistors electrically connected to the plurality of LEDs and configured to drive the plurality of LEDs, and wherein at least one of the plurality of LEDs comprises: a first semiconductor layer; a plurality of active elements disposed on the first semiconductor layer, each of the plurality of active elements spaced apart from each other and having a width less than a width of the first semiconductor layer; and a second semiconductor layer disposed on the plurality of active elements.

The display device may further comprise a first electrode in contact with the first semiconductor layer; and a second electrode in contact with the second semiconductor layer.

The first electrode, the first semiconductor layer, the plurality of active elements, the second semiconductor layer, and the second electrode may be sequentially arranged in a first direction.

The first electrode, the first semiconductor layer, the plurality of active elements, the second semiconductor layer, and the second electrode may be arranged in a first direction perpendicular to a second direction, which is a thickness direction of the substrate.

The first electrode, the first semiconductor layer, the plurality of active elements, the second semiconductor layer, and the second electrode may be arranged in a first direction parallel to a second direction, which is a thickness direction of the substrate.

Each of the plurality of active elements may have a first end in contact with the first semiconductor layer and a second end in contact with the second semiconductor layer.

Each of the plurality of active elements may be in a strain state.

A width of each of the plurality of active elements may be greater than or equal to about 10 nm and less than or equal to about 100 nm.

The first semiconductor layer may comprise: a plurality of first semiconductor elements respectively in contact with the plurality of active elements, the plurality of first semiconductor elements being spaced apart from each other; and a first semiconductor common layer in contact with each of the plurality of first semiconductor elements.

The display device may further comprise an insulating layer disposed between the plurality of active elements on the first semiconductor layer.

The insulating layer may comprise a mesh structure.

Each of the plurality of active elements may comprise $In_xGa1-xN$ ($0 \leq x \leq 1$).

Each of the plurality of active elements may emit red light.

According to another aspect of the disclosure, there is provided a light emitting diode (LED) comprising: a first semiconductor layer having a first portion and a plurality of second portions formed on the first portion of the first semiconductor layer; a plurality of active elements, each formed on one of the plurality of second portions; and a second semiconductor layer disposed on the plurality of active elements, wherein each of the plurality of second portions has a width less than a width of the first portion of the first semiconductor layer.

According to another aspect of the disclosure, there is provided a method of manufacturing a light emitting diode (LED) comprising: forming a first semiconductor common layer on a base substrate; forming an insulating layer including a plurality of openings on an upper surface of the first semiconductor common layer; and forming a first semiconductor element, an active element, and a second semiconductor element by growing a first semiconductor material, an active material, and a second semiconductor material in the plurality of openings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
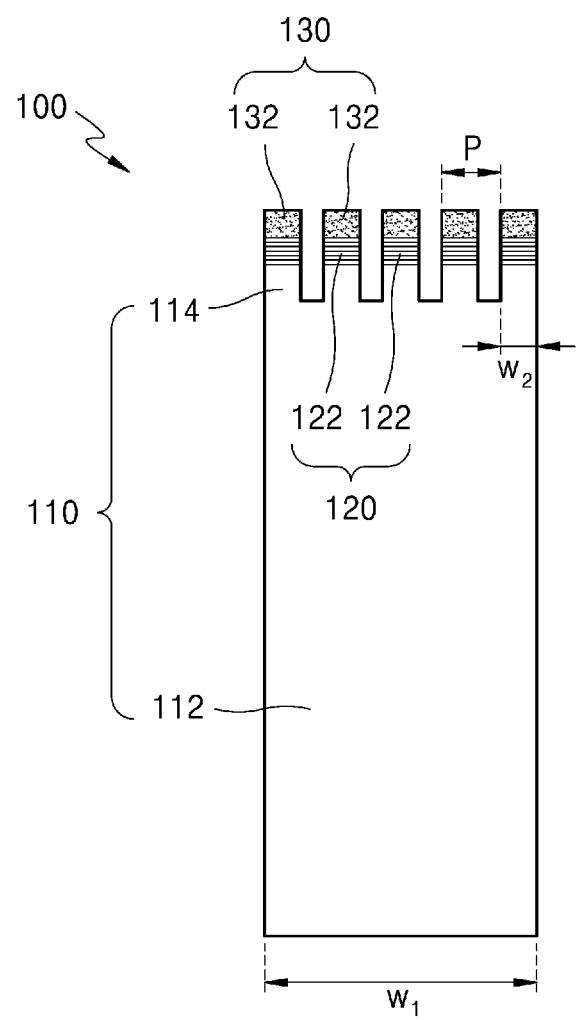
FIG. 1 is a cross-sectional view illustrating a semiconductor light emitting diode (LED) according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. Embodiments described below are merely examples and various modifications may be made therein. In the drawings, the same reference numerals represent the same elements, and a size of each element may be exaggerated for clarity and convenience of description.

As used herein, the term "on" or "above" an element may be understood to mean that the element may be directly on another element or be on another element not in contact with the other element.

The terms 'first', 'second,' etc. may be used to describe various elements but are only used herein to distinguish one element from another element. These terms are not intended to limit materials or structures of elements.

As used herein, the singular expressions are intended to include plural forms as well, unless the context clearly dictates otherwise. It will be understood that when an element is referred to as "including" another element, the element may further include other elements unless mentioned otherwise.

Terms such as "unit", "module," and the like, when used herein, represent units for processing at least one function or operation, which may be implemented by hardware, software, or a combination of hardware and software.

The term "the" and demonstratives similar thereto may be understood to include both singular and plural forms.

Unless explicitly stated that operations of a method should be performed in an order described below, the operations may be performed in an appropriate order. In addition, all terms indicating examples (e.g., etc.) are only for the purpose of describing technical ideas in detail, and thus the scope of the present disclosure is not limited by these terms unless limited by the claims.

FIG. 1 is a cross-sectional view illustrating a semiconductor light emitting diode (LED) 100 according to an example embodiment. As shown in FIG. 1, the semiconductor LED 100 may be an inorganic-based LED, and may emit light of a specific wavelength according to a material included in the LED 100. The LED 100 may include a first semiconductor layer 110, an active layer 120, and a second semiconductor layer 130.

The first semiconductor layer 110 may include, for example, an n-type semiconductor, but is not necessarily limited thereto. In some cases, the first semiconductor layer 110 may include a p-type semiconductor. The first semiconductor layer 110 may include a III-V group n-type semiconductor, for example, n-GaN. The first semiconductor layer 110 may have a single-layer or multi-layer structure. For example, the first semiconductor layer 110 may include any one semiconductor material of InAlGaN, GaN, AlGaN, InGaN, AlN, and InN, and may include a semiconductor layer doped with a conductive dopant such as Si, Ge, Sn, etc.

The active layer 120 may be disposed on the upper surface of the first semiconductor layer 110. The active layer 120 may generate light while electrons and holes are combined, and may have a multi-quantum well (MQW) structure or a single-quantum well (SQW) structure. The active layer 120 may include a III-V group semiconductor, such as InGaN, GaN, AlGaN, AlInGaN, etc. A clad layer doped with a conductive dopant may be formed on the upper and/or lower portions of the active layer 120. For example, the clad layer may be implemented as an AlGaN layer or an InAlGaN layer.

The second semiconductor layer 130 may be provided on the active layer 120 and may include a semiconductor layer of a different type from the first semiconductor layer 110. For example, the second semiconductor layer 130 may include a p-type semiconductor layer. The second semiconductor layer 130 may include, for example, InAlGaN, GaN, AlGaN, and/or InGaN, and may be a semiconductor layer doped with a conductive dopant such as Mg, etc. According to an example embodiment, the clad layer doped with the conductive dopant may be formed on the upper and/or lower portions of the active layer 120 so as to be disposed between the active layer 120 and the second semiconductor layer 130.

In addition to the first semiconductor layer 110, the active layer 120, and the second semiconductor layer 130 described above, the LED 100 may further include another clad layer and/or electrode on the upper and/or lower portions of each layer.

The wavelength of the emitted light may be different according to the material concentration in the active layer 120. For instance, the higher the concentration of indium In, the larger the wavelength of the emitted light. For example, when the concentration of In of the active layer 120 is about 15%, the active layer 120 may emit blue light of about 450 nm, and when the concentration of In of the active layer 120 is about 25%, the active layer 120 may emit green light of about 520 nm. In addition, when the concentration of In of the active layer 120 is about 35%, the active layer 120 may emit red light of about 630 nm.

Figure 2:
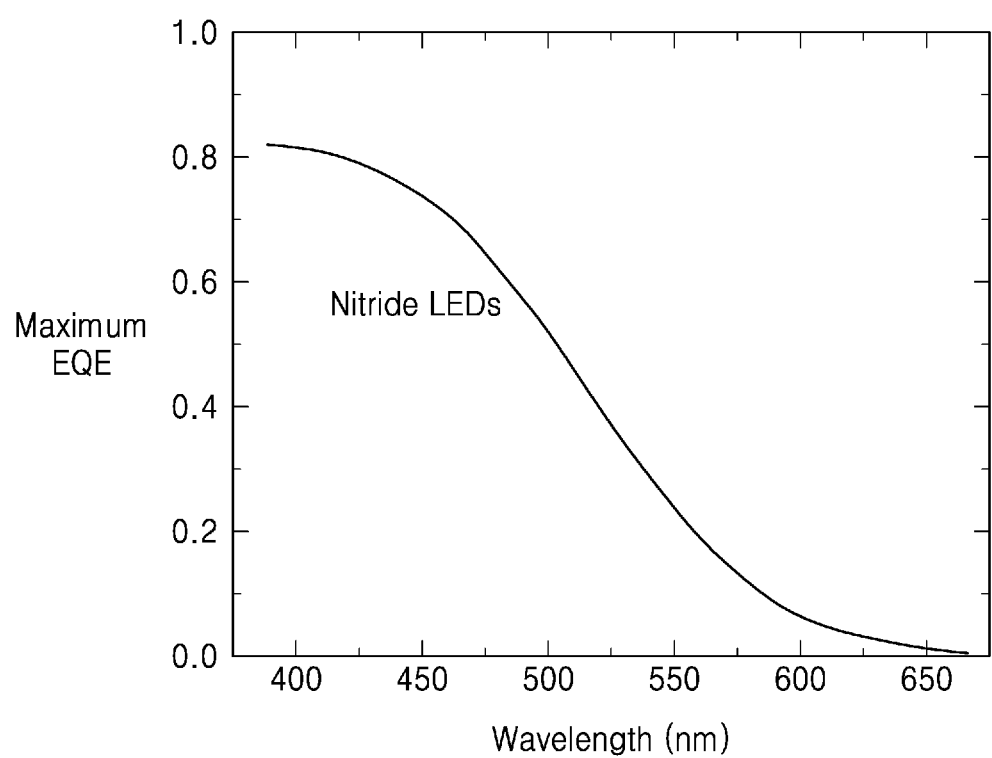
FIG. 2 is a graph illustrating the emission efficiency according to the wavelength of an active layer of the related art.

Meanwhile, in an active layer of the related art, when the increase in the concentration of In results in the increase in the wavelength of the emitted light, the efficiency of an LED is rapidly reduced. FIG. 2 is a graph illustrating the emission efficiency according to the wavelength of an active layer of the related art. As shown in FIG. 2, when the active layer includes a material that emits blue light of about 450 nm, the maximum value of the external quantum efficiency of the active layer is about 0.7. However, when the active layer includes a material that emits red light of about 630 nm, the maximum value of the external quantum efficiency of the active layer is less than 0.1. This is because as the concentration of In increases, a lattice mismatch occurs between materials in the active layer, for example, InGaN and GaN. This lattice mismatch may cause strain or defect on the material in the active layer, and the strain may change a phase separation state of the active layer.

Figure 3A:
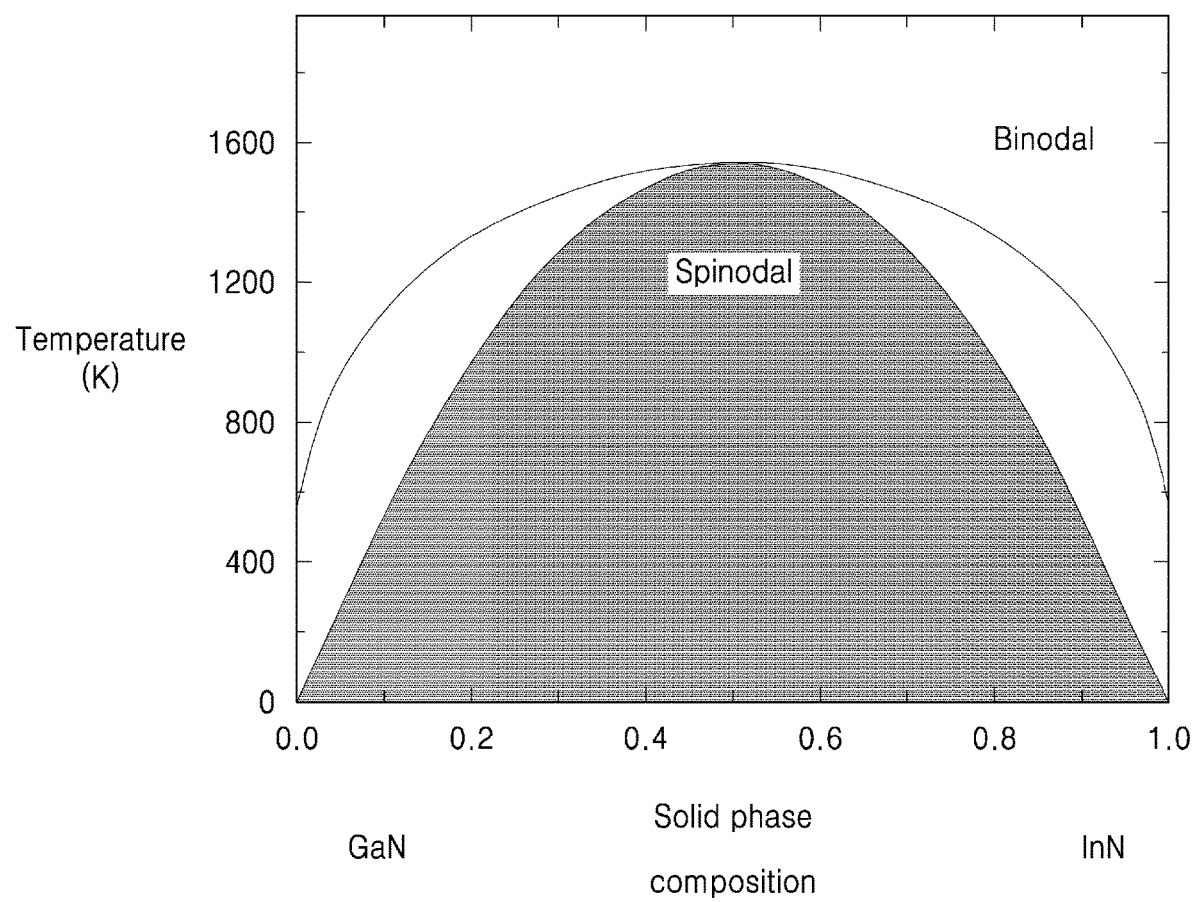
FIG. 3A is a graph illustrating a phase separation state according to the material content of $In_xGa_{(1-y)}N$ in a relax state.
Figure 3B:
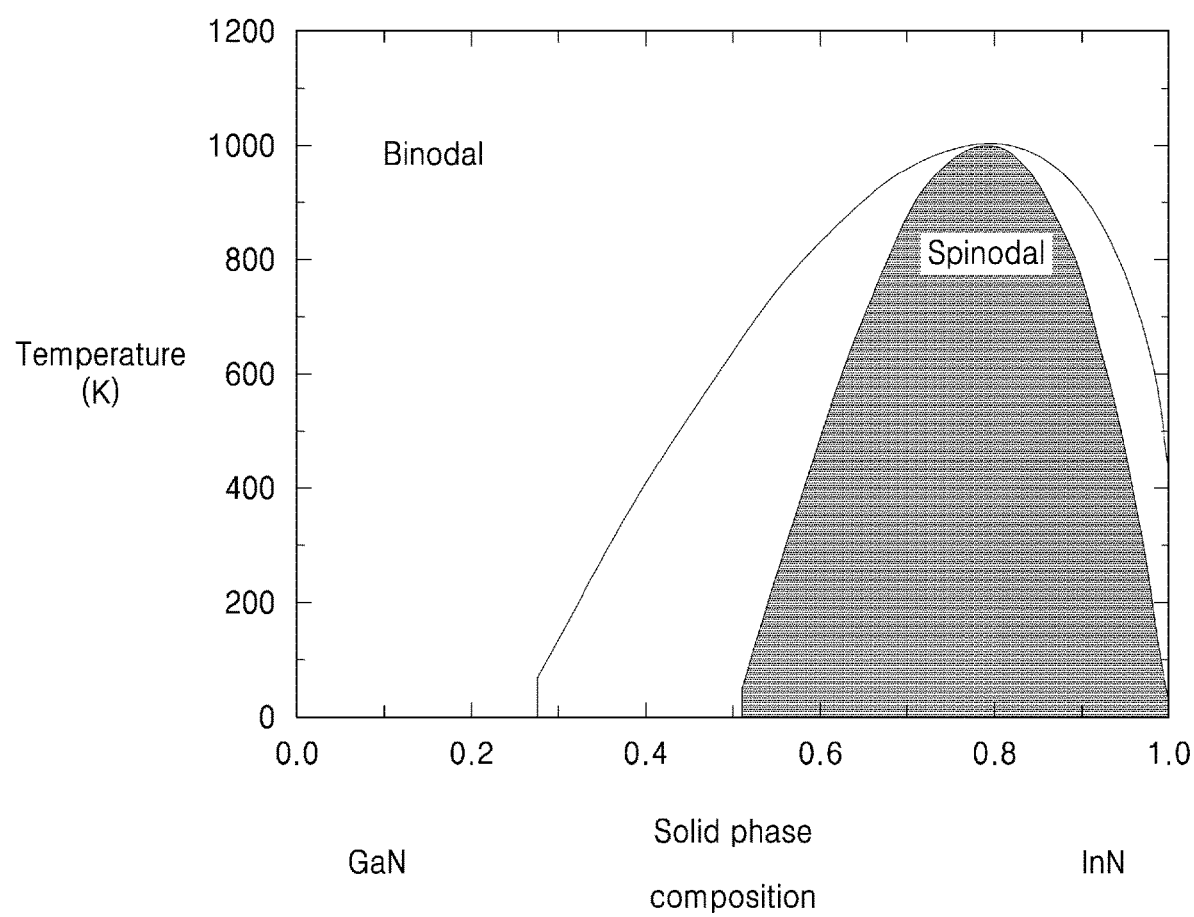
FIG. 3B is a graph illustrating a phase separation state according to the material content of $In_xGa_{(1-y)}N$ in a strain state.

FIG. 3A is a graph illustrating a phase separation state according to the material concentration of $In_xGa_{(1-y)}N$ in a relax state, and FIG. 3B is a graph illustrating a phase separation state according to the material concentration of $In_xGa_{(1-y)}N$ in a strain state.

As shown in FIGS. 3A and 3B, when the $In_xGa_{(1-y)}N$ in the relax state includes the concentration of In of 0.5 or less, according to the temperature, $In_xGa_{(1-y)}N$ may be in a spinodal state or a binodal state. In particular, when the concentration of In is about 0.3 to 0.5, $In_xGa_{(1-y)}N$ is may be in the spinodal state in most temperature ranges. In the spinal state, it means that the active layer may become unstable, which may be a limitation to the manufacturing process of the LED including the active layer.

In FIG. 3B, when the $In_xGa_{(1-y)}N$ in the strain state includes the concentration of In of 0.5 or less, for example, 0.3 to 0.5, the active layer may be in the binodal state in all temperature ranges. Therefore, when the concentration of In is 0.5 or less in the strain state, it means that $In_xGa_{(1-y)}N$ may maintain a stable state regardless of temperature. This strain state may be obtained when the active layer has the lattice mismatch.

Meanwhile, the strain occurred by the lattice mismatch may be extinguished when the thickness of the active layer increases to cause defect such as dislocation. Therefore, it is desirable to obtain the active layer that maintains the strain state in which no defect occurs.

Figure 4:
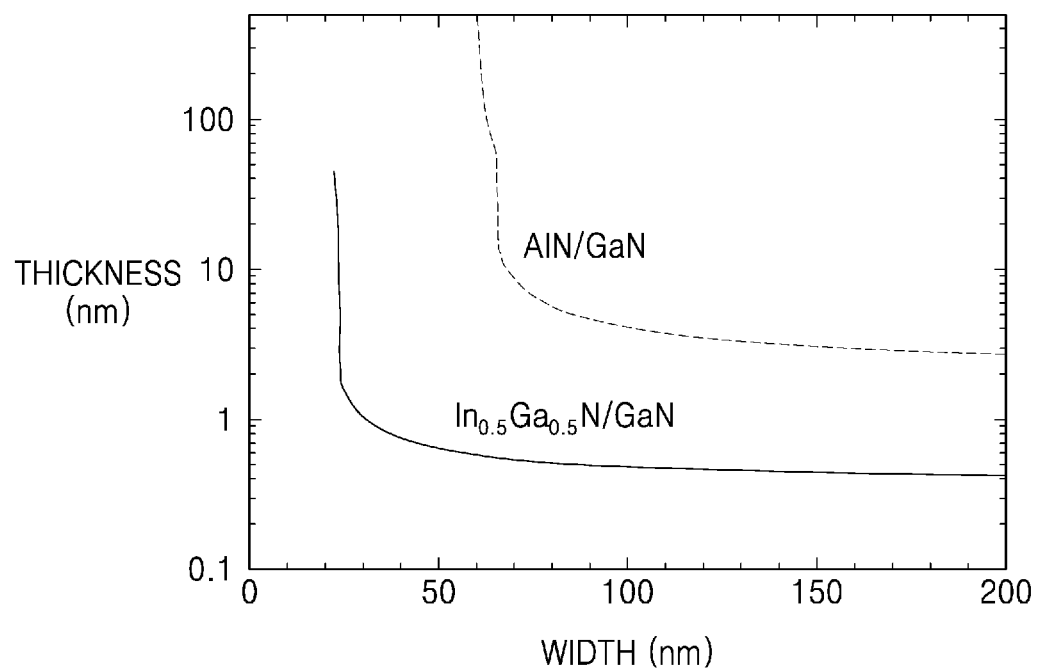
FIG. 4 is a diagram illustrating a relationship between the width and the thickness that may maintain strain for each material according to an example embodiment.

The width and thickness of the active layer with strain may be determined by a lattice constant of materials in the active layer. FIG. 4 is a diagram illustrating a relationship between the width and the thickness that may maintain strain for each material according to an embodiment. As shown in FIG. 4, the width and thickness that may maintain the strain varies depending on the material. Further, even with the same material, the larger the width, the smaller the thickness that may maintain the strain. For example, when $In_{0.5}Ga_{0.5}N$ having a width of 150 nm or more is to be stacked on a GaN layer, the $In_{0.5}Ga_{0.5}N$ may maintain the strain only when $In_{0.5}Ga_{0.5}N$ having a thickness of about 0.5 nm or less is stacked. However, stacking layers with the thickness of 0.5 nm or less causes many difficulties in the process.

In order to overcome the difficulties in the process, the strain may be maintained by reducing the width of an active layer. For example, when $In_{0.5}Ga_{0.5}N$ having a thickness of 1 nm or more is to be stacked, $In_{0.5}Ga_{0.5}N$ having a width of 30 nm or less may be formed, thereby reducing the occurrence of defects and maintaining the strain. In particular, when materials with a large lattice mismatch are stacked, limiting the width may effectively reduce the occurrence of defects.

Accordingly, the active layer 120 according to an embodiment may include a plurality of active elements 122 having a nano-scale width. Referring back to FIG. 1, the active layer 120 may include the plurality of active elements 122 that are spaced apart on the first semiconductor layer 110. The plurality of active elements 122 may be arranged one or two dimensionally in a direction parallel to a width $W_1$ direction of the first semiconductor layer 110.

A width $W_2$ of each active element 122 may be nano-sized. For example, the width $W_2$ of the active element 122 may be greater than or equal to about 10 nm and less than or equal to about 100 nm. In addition, a pitch P between the active elements 122 may be 10 μm or less, for example, about 20 nm or more and about 300 nm or less. The thickness of each active element 122 may be greater than or equal to about 1 nm and less than or equal to about 100 nm. As described above, because the width $W_2$ of the active element 122 is small, even when a lattice mismatch in the active element 122 or a lattice mismatch between the active element 122 and the first and second semiconductor layers 110 and 130 is large, the occurrence of defects may be reduced.

When the active layer 120 includes the plurality of active elements 122 having a small width as described above, even when the concentration of In is high, the occurrence of defects is prevented, and thus light with high light efficiency may be emitted. For example, the active element 122 may include $In_xGa_{1-x}N$ (0≤x≤1), and the concentration of In may be 35% or more by which red light may be emitted.

Meanwhile, the first semiconductor layer 110 may include a first semiconductor common layer 112 and a plurality of first semiconductor elements 114 that are spaced apart on the first semiconductor common layer 112. The first semiconductor common layer 112 and the plurality of first semiconductor elements 114 may include the same material, and the width $W_1$ of the first semiconductor common layer 112 may be the width of the LED 100. The first semiconductor common layer 112 may have a width of about 1 μm or less, for example, about 600 nm or less.

The plurality of first semiconductor elements 114 may be spaced apart on the first semiconductor common layer 112, and each of the first semiconductor elements 114 may overlap and be in contact with the active element 122. The width $W_2$ of each of the first semiconductor elements 114 may be the same as the width $W_2$ of the active elements 122. For example, the width $W_2$ of the first semiconductor element 114 may be greater than or equal to about 10 nm and less than or equal to about 100 nm. In addition, the pitch P between the first semiconductor elements 114 may be 10 μm or less, for example, greater than or equal to about 20 nm and less than or equal to about 300 nm. The first semiconductor element 114 mat serve as a seed layer when the active element 122 grows, and has a narrow width, even when there is a lattice mismatch between the first semiconductor element 114 and the active element 122, no defect may occur.

As described above, the first semiconductor layer 110 may include the first semiconductor common layer 112 and the first semiconductor element 114, stably provide electrons or holes to the active layer 120 through the first semiconductor common layer 112 having the wide width, and prevent the occurrence of defects in the active element 122 through the first semiconductor element 114 having the narrow width.

The second semiconductor layer 130 may include a plurality of second semiconductor elements 132 that are spaced apart. Each of the second semiconductor elements 132 may overlap and be in contact with the active element 122 and have the same width as the width of the active element 122. The width of the second semiconductor element 132 may be greater than or equal to about 10 nm and less than or equal to about 100 nm, and the pitch P between the second semiconductor elements 132 may be 10 μm or less, for example, greater than or equal to about 20 nm and less than or equal to about 300 nm. Even when there is the lattice mismatch between the second semiconductor element 132 and the active element 122, no defect may occur because the width of the second semiconductor element 132 is narrow.

Figure 5:
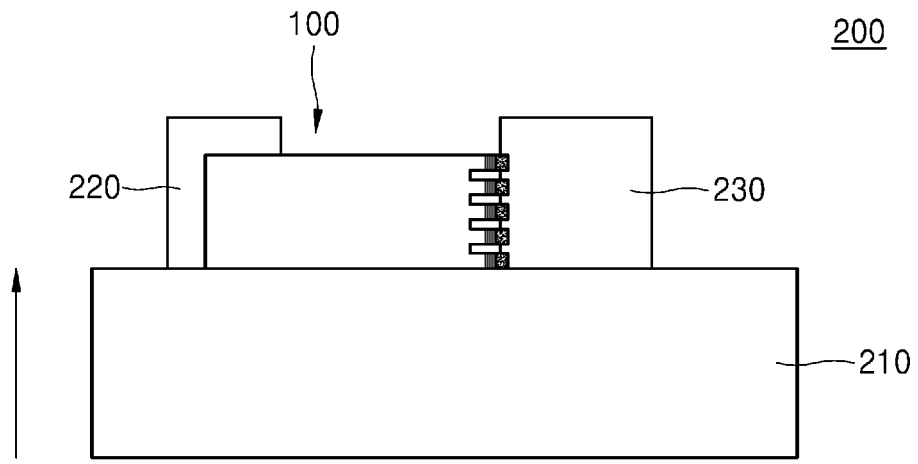
FIG. 5 is a diagram illustrating a light emitting device including an LED according to an example embodiment.

FIG. 5 is a diagram illustrating a light emitting device 200 including the LED 100 according to an example embodiment. As shown in FIG. 5, the light emitting device 200 may include a substrate 210, the LED 100 disposed on the substrate 210, and first and second electrodes 220 and 230 in contact with the LED 100.

The substrate 210 may include an insulating material such as glass, organic polymer, crystal, etc. Further, the substrate 210 may include a material having flexibility to bend or fold, and may have a single-layer structure or a multi-layer structure. The substrate 210 may include a transistor capable of driving the LED 100, etc.

The LED 100 may include the first semiconductor layer 110, the active layer 120, and the second semiconductor layer 130 illustrated in FIG. 1. As described in FIG. 1, the first semiconductor layer 110 may include the first semiconductor common layer 112 and the plurality of first semiconductor elements 114, and the active layer 120 may include the plurality of active elements 122, and the second semiconductor layer 130 may include the plurality of second semiconductor elements 132. Each component of the LED 100 has been described above, and thus a detailed description thereof is omitted.

The thickness direction of the LED 100 and the thickness direction of the substrate 210 may be perpendicular to each other. For example, as shown in FIG. 5, the first semiconductor layer 110, the active layer 120 and the second semiconductor layer 130 of the LED 100 may be sequentially arranged in a direction perpendicular to the thickness direction (depicted by the arrow in FIG. 5) of the substrate 210. Light of a desired wavelength may be emitted from the plurality of active elements 122 overlapping in the thickness direction of the substrate 210.

The first and second electrodes 220 and 230 may be disposed on the substrate 210. The first and second electrodes 220 and 230 may be spaced apart from each other with the LED 100 therebetween, and the first electrode 220 may be disposed in contact with the first semiconductor layer 110 and the second electrode 230 may be disposed in contact with the second semiconductor layer 130. The first and second electrodes 220 and 230 may be disposed on the same plane and may have the same thickness. When the first and second electrodes 220 and 230 have the same thickness, the LED 100 may be more stably connected to the first and second electrodes 220 and 230.

The first and second electrodes 220 and 230 may include a conductive material. The conductive material may include metal such as Ag, Mg, Al, Pt, Pd, Au, Ni, Nd, Ir, Cr, and alloys thereof, conductive oxide such as Indium Tin Oxide (ITO), Indium Zinc Oxide (IZO), Zinc Oxide (ZnO), Indium Tin Zinc Oxide (ITZO), conductive polymer such as PEDOT, etc.

FIGS. 6A to 6H are diagrams illustrating a method of manufacturing a light emitting device according to an embodiment.

Figure 6A:
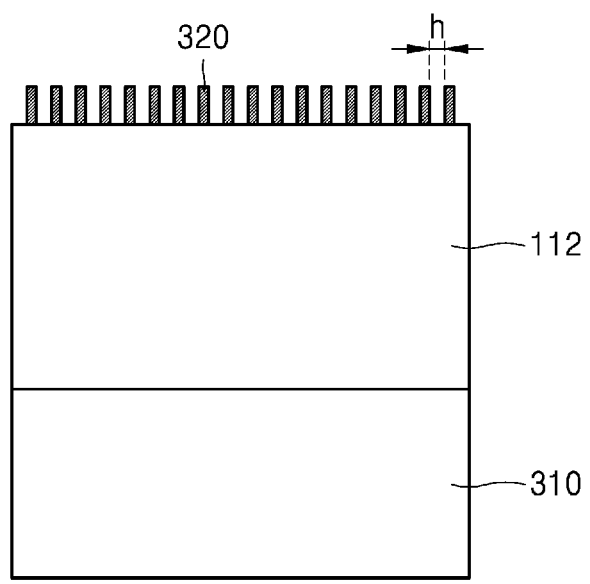
FIGS. 6A to 6H are diagrams illustrating a method of manufacturing a light emitting device according to an example embodiment.

First, as shown in FIG. 6A, the first semiconductor common layer 112 may be formed on a base substrate 310. The base substrate 310 may be a substrate for growing the LED 100. The base substrate 310 may include various materials used in general semiconductor processes. For example, a silicon substrate or a sapphire substrate may be used as the base substrate 310.

The first semiconductor common layer 112 may be formed using a method such as a metal organic chemical vapor deposition (MOCVD), a chemical vapor deposition (CVD), a plasma-enhanced chemical vapor deposition (PECVD), a molecular beam epitaxy (MBE), a hydride vapor phase epitaxy (HVPE), etc. The first semiconductor common layer 112 may be formed with a thickness of about 5 µm or less.

Then, an insulating layer 320 including a plurality of openings h may be formed on the first semiconductor common layer 112. The insulating layer 320 may be a mesh structure including the plurality of openings h. For example, an insulating material layer may be formed on the first common semiconductor layer 112 and then the opening h may be patterned. The size of the opening h may be greater than or equal to about 10 nm and less than or equal to about 100 nm, and the shape of the opening h may be circular, elliptical and/or polygonal. The plurality of openings h may be arranged one or two dimensionally, and may have the same size or different sizes. The shape and width of the opening h may be used to determine the shapes and widths of the first semiconductor element 114, the active element 122, and the second semiconductor element 132 that are formed later.

Figure 6B:
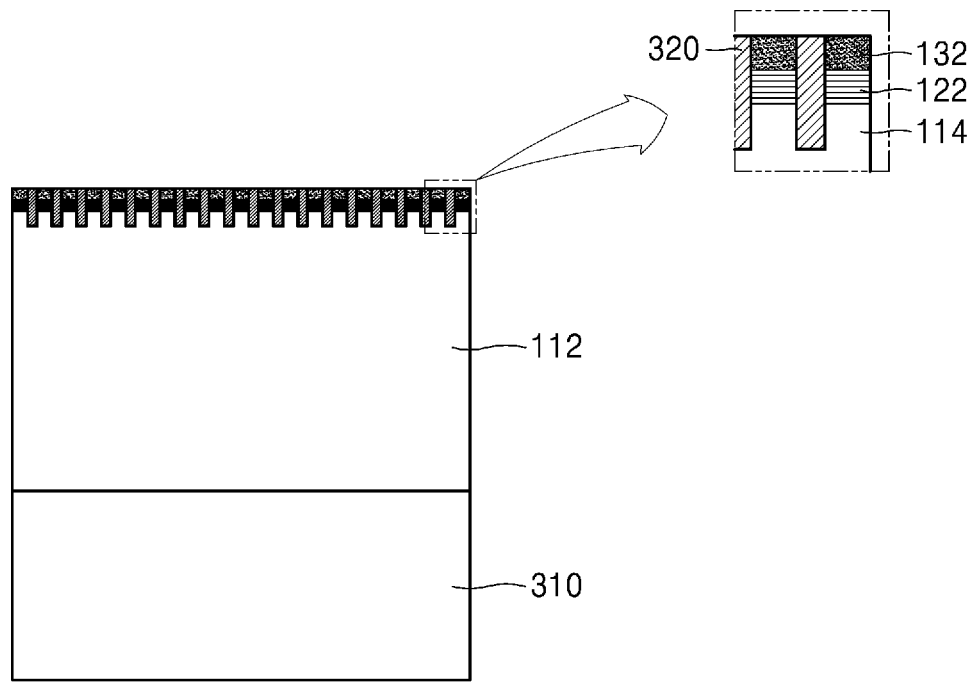

As shown in FIG. 6B, the first semiconductor element 114, the active element 122, and the second semiconductor element 132 may be formed by growing a first semiconductor material, an active material, and a second semiconductor material in the plurality of openings h. The first semiconductor element 114, the active element 122, and the second semiconductor element 132 may also be formed using a method such as a metal organic chemical vapor deposition (MOCVD), a chemical vapor deposition (CVD), a plasma-enhanced chemical vapor deposition (PECVD), a molecular beam epitaxy (MBE), a hydride vapor phase epitaxy (HVPE), etc.

Figure 6C:
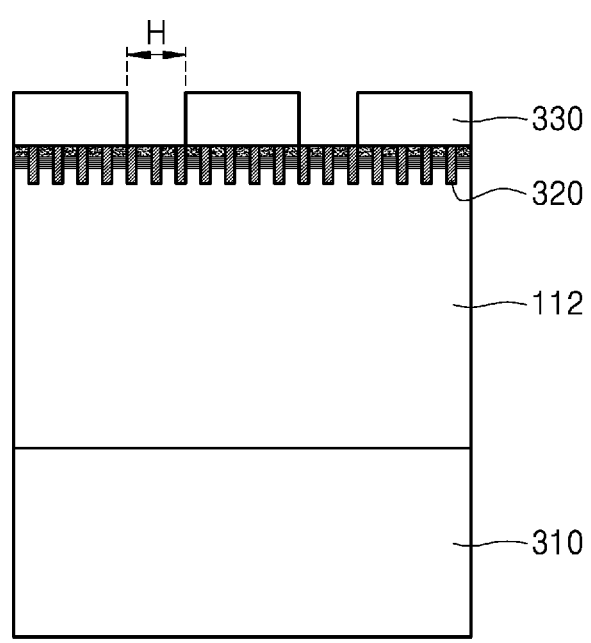

As shown in FIG. 6C, masks 330 spaced apart by a predetermined interval H may be disposed on the insulating layer 320. The widths of the masks 330 spaced apart may be used to determine the width $W_1$ of the LED 100, and, for example, may be about 600 nm or less.

Figure 6D:
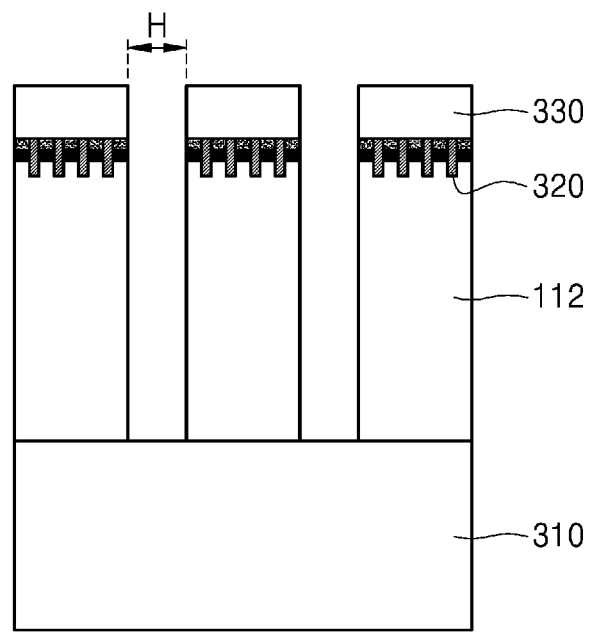

As shown in FIG. 6D, a material in the region H that does not overlap the mask 330 among the materials stacked on the substrate 310 may be removed by etching.

Figure 6E:
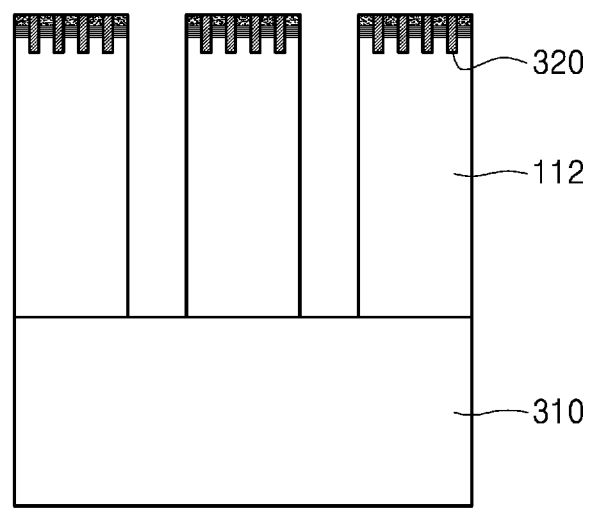

As shown in FIG. 6E, the mask 330 may be removed. A process of using the mask 330 to obtain a plurality of LEDs has been described in FIGS. 6C to 6E. When manufacturing one LED, the process of using the mask 330 is not required, and thus the processes of FIGS. 6C to 6E may be omitted.

Figure 6F:
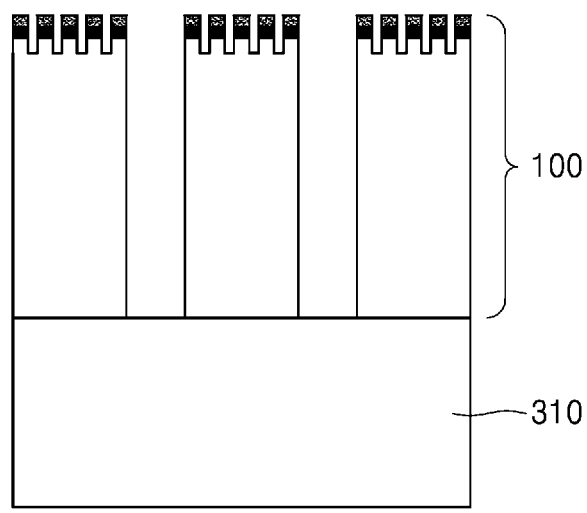

Next, as shown in FIG. 6F, the insulating layer 320 may be removed by etching.

Figure 6G:
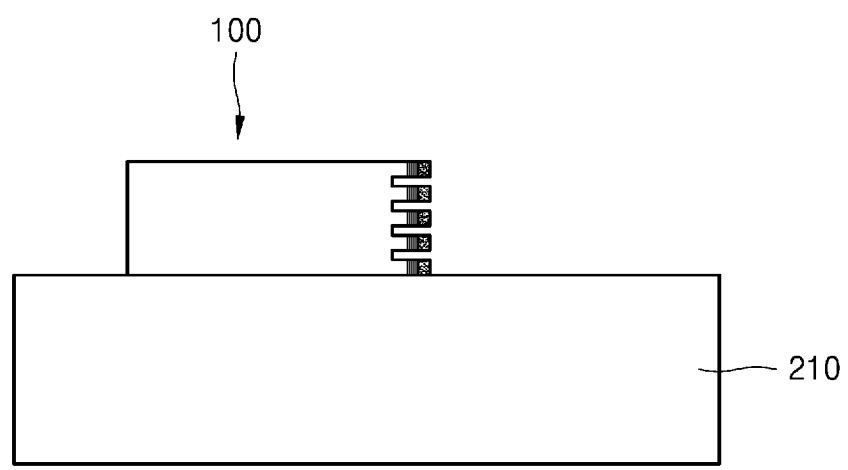

As shown in FIG. 6G, the LED 100 may be separated from the substrate 310 and then transferred to the substrate 210.

Figure 6H:
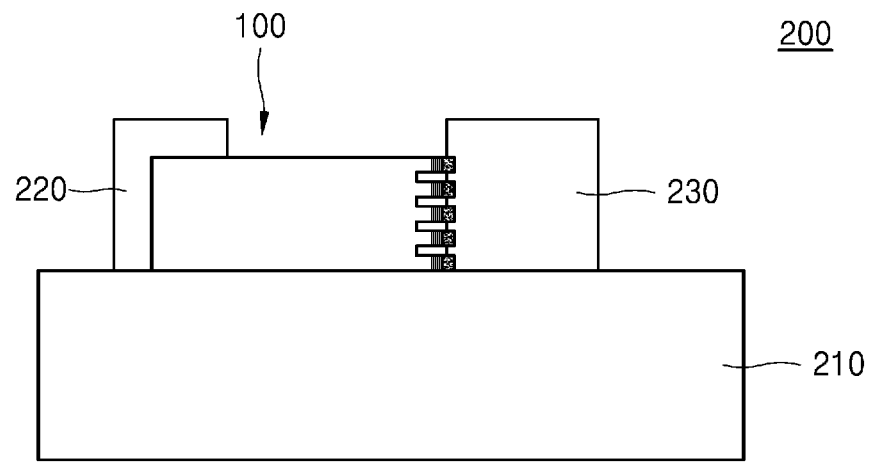

As shown in FIG. 6H, the first and second electrodes 220 and 230 may be formed on the substrate 210. The second electrode 230 may be formed in contact with the second semiconductor layer 130 of the LED 100 such that the first electrode 220 may be formed in contact with the first semiconductor layer 110 of the LED 100.

In FIGS. 6G and 6H, the first and second electrodes 220 and 230 are formed after transferring the LED 100 to the substrate 210, but the present disclosure is not limited thereto. After forming the electrodes 220 and 230 on the substrate 210, the LED 100 may be transferred.

Figure 7A:
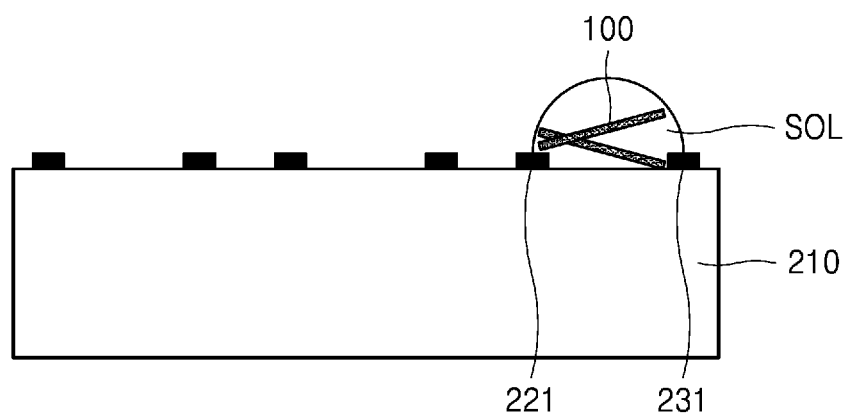
FIGS. 7A to 7C are diagrams illustrating a method of manufacturing a light emitting device according to another example embodiment.
Figure 7B:
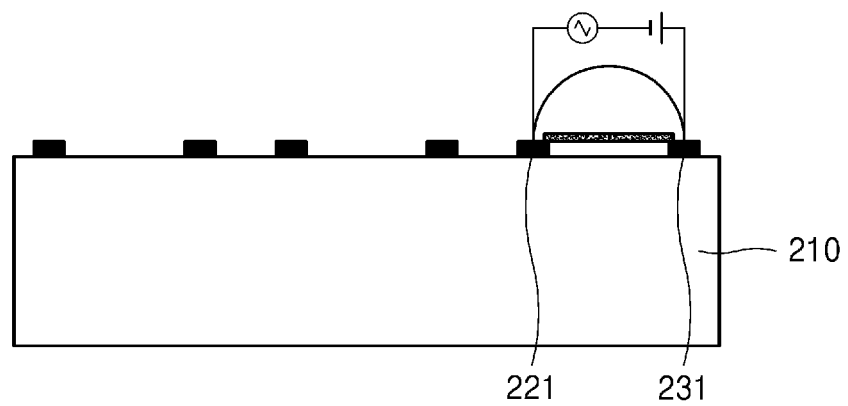
Figure 7C:
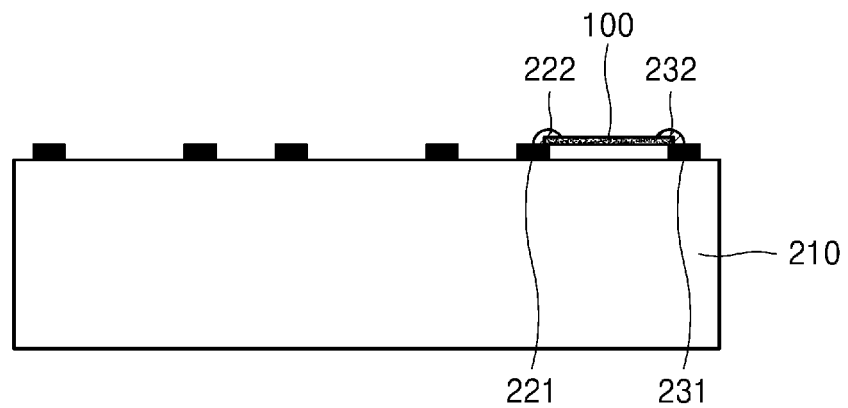

FIGS. 7A to 7C are diagrams illustrating a method of manufacturing a light emitting device according to another example embodiment.

As shown in FIG. 7A, first and second sub-electrodes 221 and 231 may be formed on the substrate 210, and a solution SOL including the LED 100 may be dispersed in a region between the first and second sub-electrodes 221 and 231. The dispersion of the solution SOL may use an inkjet printing method, but is not limited thereto.

As shown in FIG. 7B, when an electric field is applied between the first and second sub-electrodes 221 and 231, the LED 100 may be self-aligned between the first and second sub-electrodes 221 and 231 by the electric field. Instead of applying the electric field after dispersing the solution SOL, the solution SOL including the LED 100 may be dispersed while the electric field is applied between the first and second sub-electrodes 221 and 231.

When the LED 100 is self-aligned, as shown in FIG. 7C, a first contact electrode 222 for electrically and/or physically and stably connecting the first sub-electrode 221 and the corresponding LED 100 may be formed on the first sub-electrode 221, and a second contact electrode 232 for electrically and/or physically stably connecting the second sub-electrode 231 and the corresponding LED 100 may be formed on the second sub-electrode 231. The first and second contact electrodes 222 and 232 may be respectively in ohmic contact with the first and second sub-electrodes 221 and 231 and the LED 100. Here, the first sub-electrode 221 and the first contact electrode 222 may be referred to as a first electrode, and the second sub-electrode 231 and the second contact electrode 232 may be referred to as a second electrode.

Figure 8:
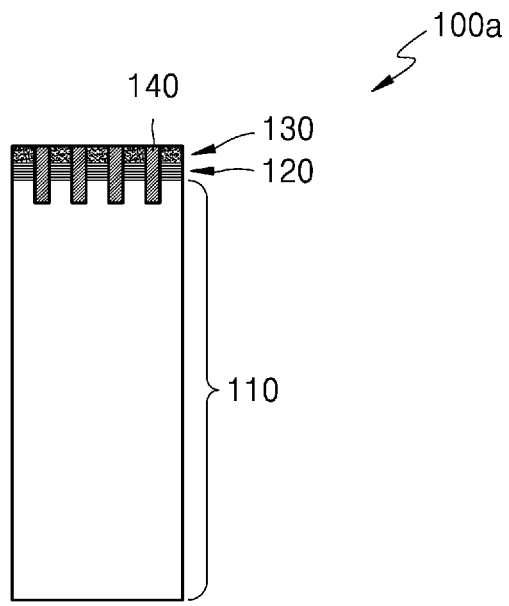
FIG. 8 is a diagram illustrating an LED according to another example embodiment.

FIG. 8 is a diagram illustrating an LED 100a according to another example embodiment. Upon comparing FIGS. 1 and 8, the LED 100a of FIG. 8 may further include an insulating layer 140 between the plurality of active elements 122. The insulating layer 140 may include a mesh structure. The insulating layer 140 included in FIG. 8 may be the insulating layer 320 formed in FIG. 6B, or an insulating layer including another insulating material after the insulating layer 320 is removed in FIG. 6F.

Figure 9:
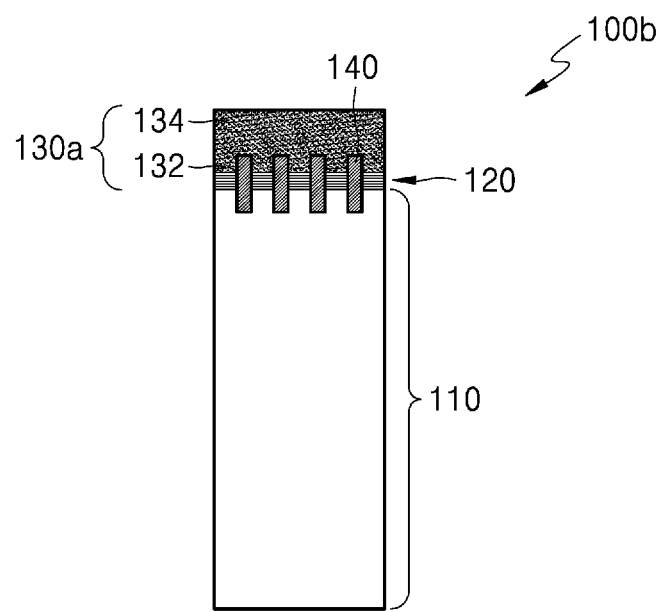
FIG. 9 is a diagram illustrating an LED according to another example embodiment.

FIG. 9 is a diagram illustrating an LED 100b according to another example embodiment. Upon comparing FIGS. 8 and 9, a second semiconductor layer 130a of the LED 100b illustrated in FIG. 9 may further include a second semiconductor common layer 134. The second semiconductor common layer 134 may include the same material as the second semiconductor element 132. Electrons or holes may be stably supplied to the active layer 120 by connecting an electrode to the second common semiconductor layer 134.

FIGS. 10A to 10H are diagrams illustrating a method of manufacturing a light emitting device including the LED 100 according to another example embodiment. Hereinafter, differences between the methods of manufacturing the light emitting device described in FIGS. 6A to 6H and FIGS. 10A to 10G will be described.

Figure 10A:
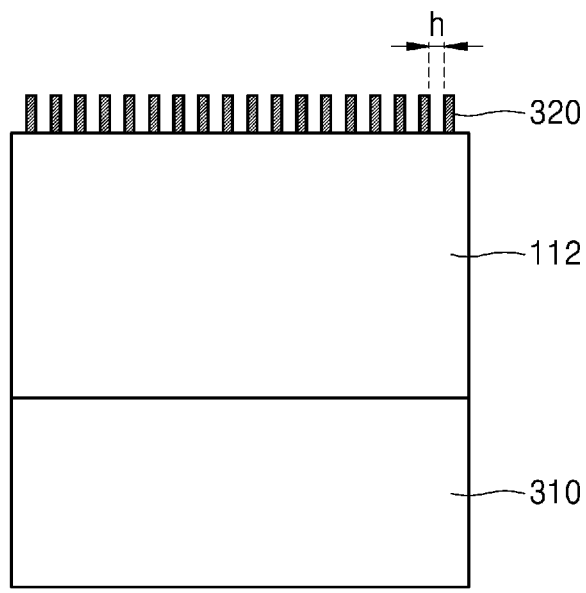
FIGS. 10A to 10G are diagrams illustrating a method of manufacturing a light emitting device including an LED according to another embodiment.

First, as shown in FIG. 10A, the first semiconductor common layer 112 may be formed on the base substrate 310. The base substrate 310 may be a substrate for growing the LED 100. The base substrate 310 may include various materials used in general semiconductor processes. Then, the insulating layer 320 including the plurality of openings h may be formed on the first semiconductor common layer 112.

Figure 10B:
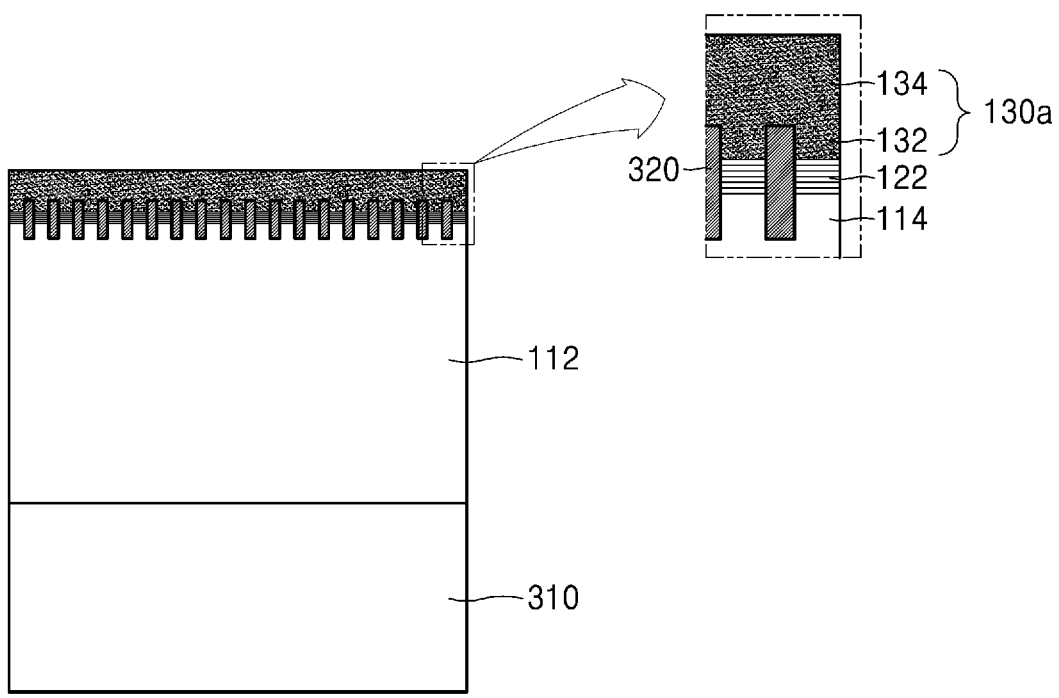
Figure 10C:
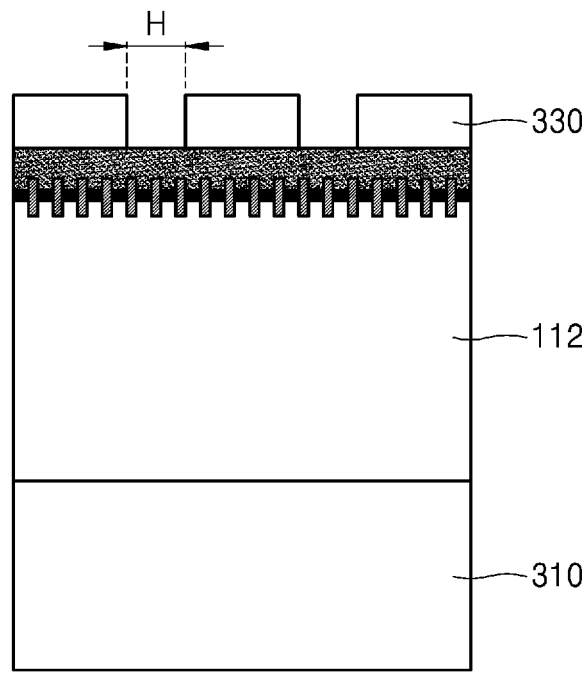

As shown in FIG. 10B, the first semiconductor element 114, the active element 122, and the second semiconductor element 132 may be formed by growing a first semiconductor material, an active material, and a second semiconductor material in the plurality of openings h. In addition, the second semiconductor common layer 134 may be further formed on the insulating layer 320 and the second semiconductor element 132. The second semiconductor common layer 134 may be formed using the same method as used in the second semiconductor element 132.

Figure 10D:
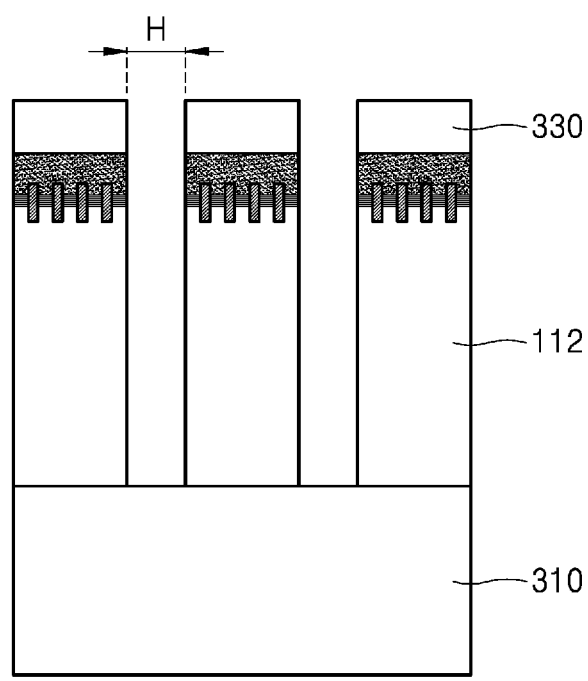
Figure 10E:
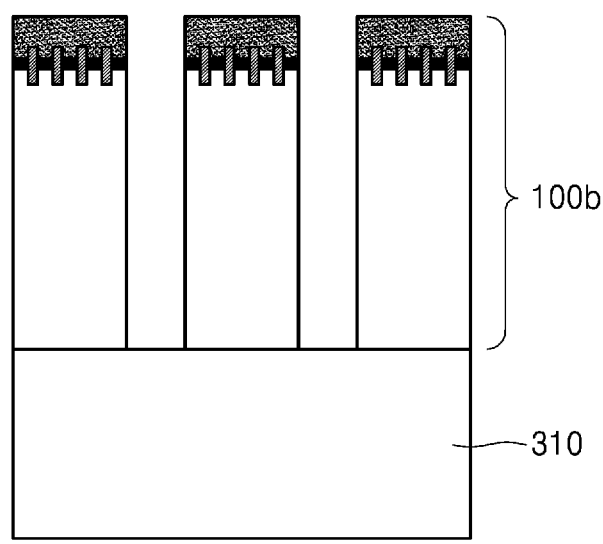

As shown in FIG. 100, the masks 330 may be disposed on the insulating layer 320 and the second semiconductor element 132 by a predetermined interval. The width of the mask 330 may be used to determine the width of the LED 100. As shown in FIG. 10D, a material in the region H that does not overlap the mask 330 among materials stacked on the substrate 210 may be removed. Then, as shown in FIG. 10E, the mask 330 may be removed.

Figure 10F:
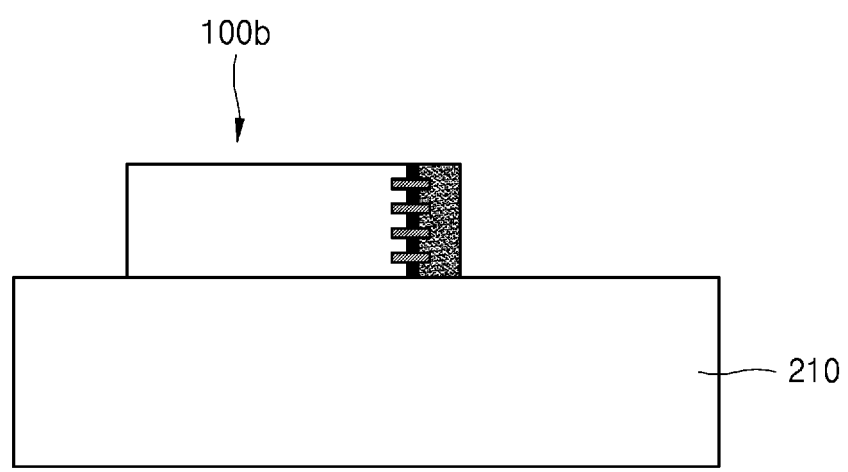
Figure 10G:
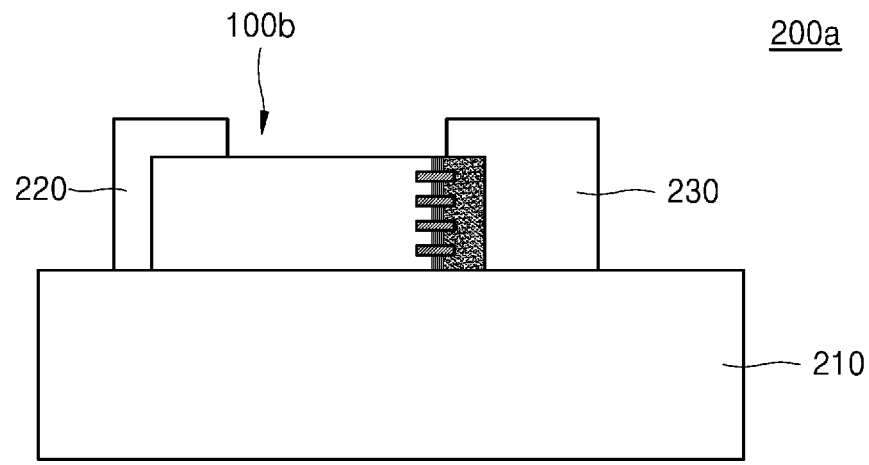

Next, as shown in FIG. 10F, the LED 100b may be transferred to the substrate 210, and, as shown in FIG. 10G, the first and second electrodes 220 and 230 may be formed on the substrate 210.

Figure 11:
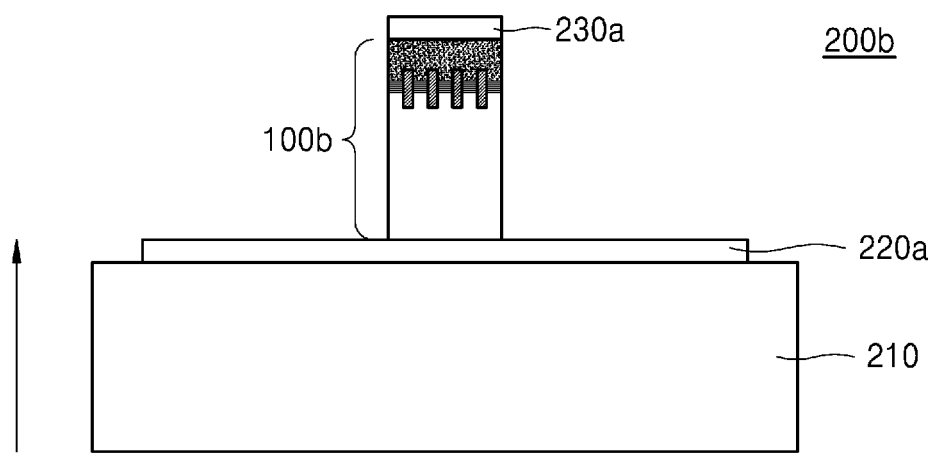
FIG. 11 is a diagram illustrating a light emitting device according to another embodiment.

FIG. 11 is a diagram illustrating a light emitting device according to another example embodiment.

As shown in FIG. 11, a first electrode 220a, the LED 100b, and a second electrode 230a may be sequentially arranged on the substrate 210 in the thickness direction (depicted by arrow in FIG. 11) of the substrate 210. The first electrode 220a, the LED 100b, and the second electrode 230a are the same as described above, and thus detailed descriptions thereof will be omitted.

Figure 12:
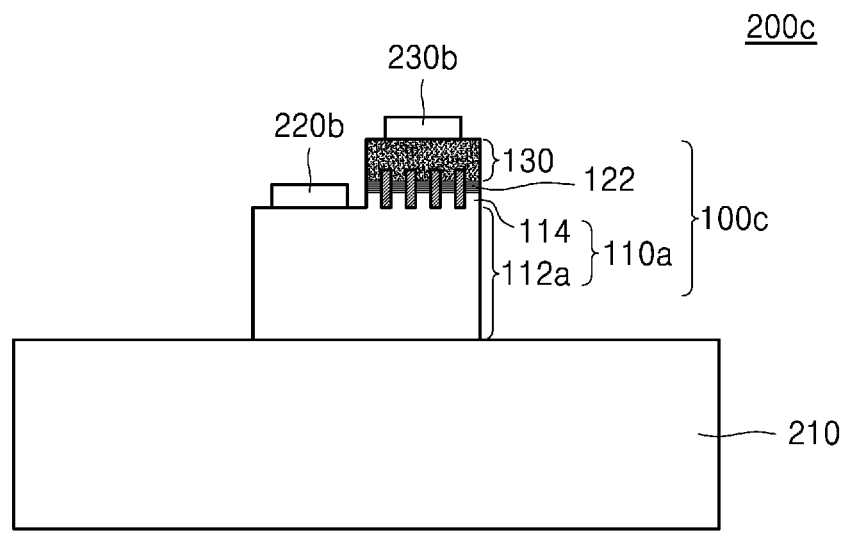
FIG. 12 is a diagram illustrating a light emitting device according to another embodiment.

FIG. 12 is a diagram illustrating a light emitting device 200c according to another example embodiment.

As shown in FIG. 12, the light emitting device 200c may include the substrate 210, an LED 100c, and first and second electrodes 220b and 230b. The LED 100c may include a first semiconductor layer 110a and the plurality of active elements 122 that are spaced apart and the second semiconductor layer 130. The first semiconductor layer 110a may include a first semiconductor common layer 112a and the plurality of first semiconductor elements 114. According to an example embodiment, insulating layers may be disposed between the plurality of active elements 122.

The first electrode 220b may be disposed on the first semiconductor common layer 112a and on the same plane as the first semiconductor common layer 112a of the first semiconductor element 114. The second electrode 230b may be disposed on the second semiconductor layer 130.

The above-described LEDs 100, 100a, 100b, and 100c may be used as light emitting sources of various display devices. For example, the LEDs 100, 100a, 100b, and 100c may be applied to an illumination device or a self-light emitting display device.

Figure 13:
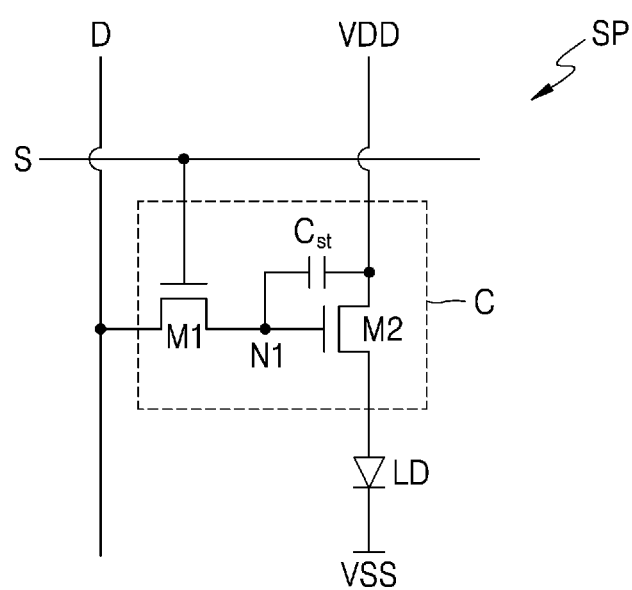
FIG. 13 is a circuit diagram illustrating a unit emission region of a light emitting device according to an embodiment.

FIG. 13 is a circuit diagram illustrating a unit emission region of a light emitting device according to an example embodiment. Referring to FIG. 13, a sub-pixel SP may include an LED LD and a driving circuit C connected thereto and driving the LED LD.

A first electrode (e.g., an anode electrode) of the LED LD is connected to a first power source VDD via the driving circuit C, and a second electrode (e.g., a cathode electrode) is connected to a second power source VSS. The LED may have the structure described above.

The first power source VDD and the second power source VSS may have different potentials. For example, the potential of the second power source VSS may be lower than the potential of the first power source VDD and equal to or more than the threshold voltage of the LED LD.

The LED LD may emit light at a luminance corresponding to the driving current controlled by the driving circuit C.

Meanwhile, although an embodiment in which only one LED LD is included in the sub-pixel SP is shown in FIG. 13, a plurality of LEDs connected in parallel with each other may be included.

The driving circuit C may include first and second transistors M1 and M2 and a storage capacitor $C_{st}$. However, the structure of the driving circuit C is not limited to the embodiment shown in FIG. 13.

A first electrode of a first transistor M1 (a switching transistor) is connected to a data line D, and a second electrode is connected to a first node N1. Here, the first electrode and the second electrode of the first transistor M1 are different electrodes. For example, when the first electrode is a source electrode, the second electrode may be a drain electrode. A gate electrode of the first transistor M1 is connected to a scan line S.

The first transistor M1 is turned on when a scan signal of a voltage (e.g., a low voltage) at which the first transistor M1 may be turned on is supplied from the scan line S, thereby electrically connecting the data line D and the first node N1. At this time, a data signal of the corresponding frame is supplied to the data line D, and accordingly, the data signal is transferred to the first node N1. The data signal transferred to the first node N1 is charged in the storage capacitor $C_{st}$.

A first electrode of the second transistor M2 (a driving transistor) is connected to the first power source VDD, and a second electrode is connected to the first electrode of the LED LD. A gate electrode of the second transistor M2 is connected to the first node N1. The second transistor M2 controls the amount of driving current supplied to the LED LD in response to the voltage of the first node N1.

One electrode of the storage capacitor $C_{st}$ is connected to the first power source VDD, and the other electrode is connected to the first node N1. The storage capacitor $C_{st}$ charges the voltage corresponding to the data signal supplied to the first node N1 and maintains the charged voltage until the data signal of a next frame is supplied.

For convenience, FIG. 13 shows the driving circuit C of a relatively simple structure including the first transistor M1 for transferring the data signal into the sub-pixel SP, the storage capacitor $C_{st}$ for storing the data signal, and the second transistor M2 for supplying the driving current corresponding to the data signal to the LED LD. However, the disclosure is not limited thereto, and the structure of the driving circuit C may be modified and implemented in various ways. For example, the driving circuit C may further include a transistor element for compensating for the threshold voltage of the second transistor M2, a transistor element for initializing the first node N1, and/or a transistor element for controlling the emission time of the LED LD or a boosting capacitor for boosting the voltage of the first node N1, etc.

In addition, in FIG. 13, transistors included in the driving circuit C, for example, the first and second transistors M1 and M2 are all illustrated as P-type transistors, but are not limited thereto. The first transistor M1 and/or the second transistor M2 included in the driving circuit C may be changed to an N-type transistor.

Figure 14:
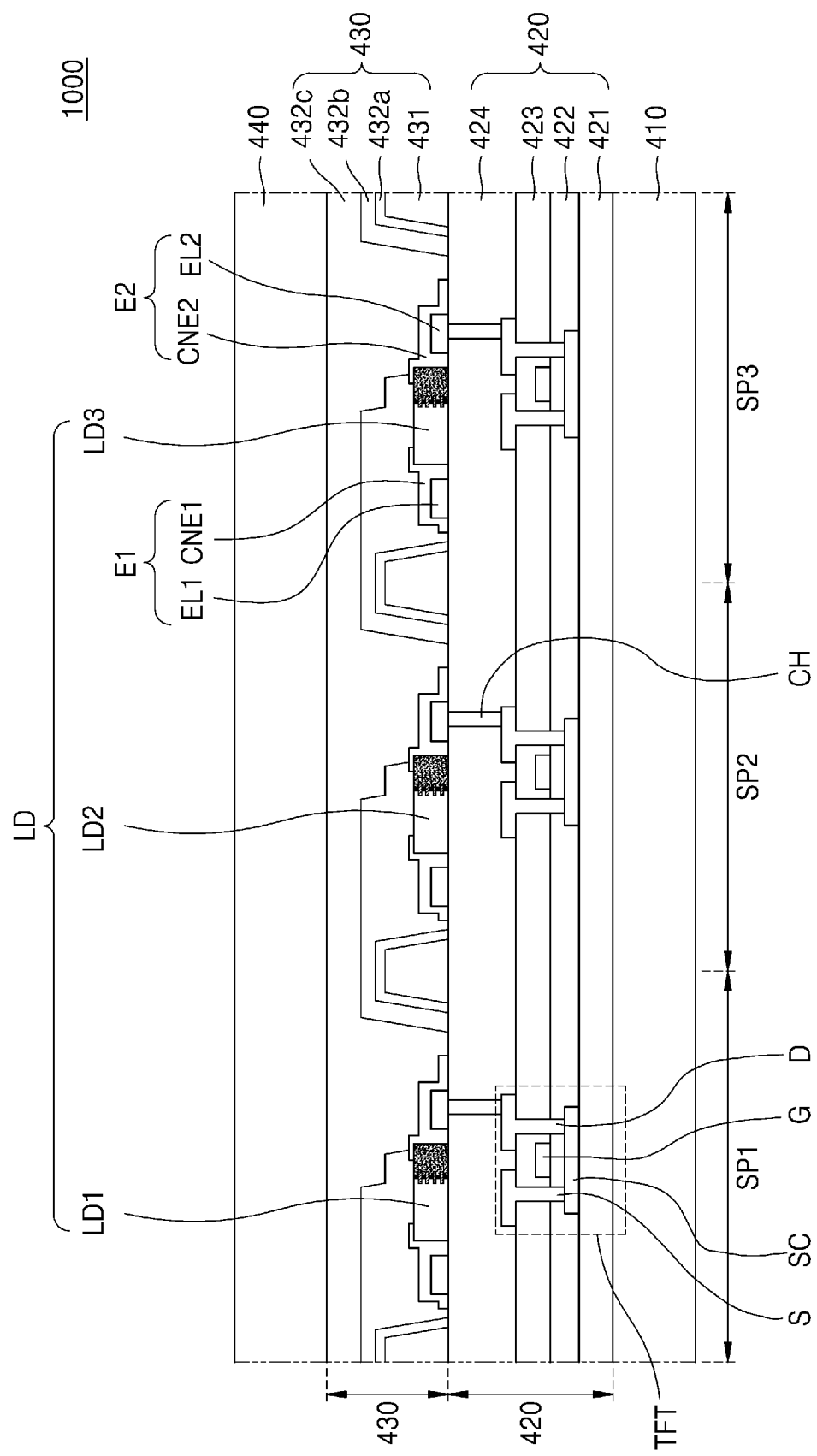
FIG. 14 is a diagram illustrating a part of a display device according to an embodiment.

FIG. 14 is a diagram illustrating a part of a display device 1000 according to an example embodiment. Referring to FIG. 14, the display device 1000 may include a substrate 410 provided with a plurality of pixels. One pixel may include a first sub-pixel SP1, a second sub-pixel SP2, and a third sub-pixel SP3 provided on the substrate 410.

The first to third sub-pixels SP1, SP2, and SP3 are pixel regions that display an image on one pixel and may be light emitting regions in which light is emitted.

Each of the first to third sub-pixels SP1, SP2, and SP3 may include the substrate 410, a driving element layer 420, a display element layer 430, and a cover structure layer 440.

The substrate 410 may include an insulating material such as glass, organic polymer, crystal, etc. Further, the substrate 410 may include a material having flexibility to bend or fold, and may have a single-layer structure or a multi-layer structure.

The driving element layer 420 may include a buffer layer 421 disposed on the substrate 410, a transistor TFT disposed on the buffer layer 421, and a driving voltage wiring (not shown).

The buffer layer 421 may prevent diffusion of impurities into the transistor TFT. The buffer layer 421 may be provided as a single layer, but may also be provided as a multi-layer of at least double layers.

When the buffer layer 421 is provided in the multi-layer, each layer may include the same material or different materials. The buffer layer 421 may be omitted according to the material and process conditions of the substrate 410.

The transistor TFT may drive a corresponding LED among a plurality of LEDs LD1, LD2, and LD3 included in the display element layer 430. The transistor TFT may include a semiconductor layer SC, a gate electrode G, a source electrode S, and a drain electrode D.

The semiconductor layer SC may be disposed on the buffer layer 421. The semiconductor layer SC may include a source region in contact with the source electrode S and a drain region in contact with the drain electrode D. A region between the source region and the drain region may be a channel region.

The semiconductor layer SC may be a semiconductor pattern including polysilicon, amorphous silicon, oxide semiconductor, etc. The channel region is a semiconductor pattern that is not doped with impurities, and may be an intrinsic semiconductor. The source region and the drain region may be semiconductor patterns doped with impurities.

The gate electrode G may be provided on the semiconductor layer SC with a gate insulating layer 422 interposed therebetween.

The source electrode S and the drain electrode D may be respectively in contact with the source region and the drain region of the semiconductor layer SC through contact holes passing through an interlayer insulating layer 423 and a gate insulating layer 422.

A protective layer 424 may be provided on the transistor TFT.

The display element layer 430 may include the plurality of LEDs LD1, LD2, and LD3 provided on the protective layer 424. For example, the LED LD1 in the first sub pixel SP1 may emit red light, the LED LD2 in the second sub pixel SP2 may emit green light, and the LED LD3 in the third sub pixel SP3 may emit blue light. In the manufacturing process of the LEDs LD1, LD2, LD3, the wavelength of emitted light may change by adjusting the concentration of In.

In the drawing, the LED 100b shown in FIG. 9 is shown as the LEDs LD1, LD2, and LD3. Alternatively, any one of the LEDs LD1, LD2, and LD3 in the first to third sub-pixels PS1, SP2, and SP3 may have structures of the LEDs 100, 100a, and 100c. For example, an LED that emits red light may be the LED 100, 100a, 100b, or 100c having the structure described above, and an LED that emits green light and an LED that emits blue light may be LEDs having different structures from those of the LEDs 100, 100a, 100b, and 100c.

The display element layer 430 may further include a pixel defining layer 431. The pixel defining layer 431 may be provided on the protective layer 424 and may partition an emission region in each of the first to third sub-pixels SP1, SP2, and SP3. The pixel defining layer 431 may include openings exposing the LEDs LD1, LD2, and LD3 respectively included in the first to third sub pixels SP1, SP2, and SP3.

The two pixel defining layers 431 adjacent to each other may be spaced apart by a predetermined interval on the substrate 410. For example, the two pixel defining layers 431 adjacent to each other may be spaced apart more than the length of the LEDs LD1, LD2, and LD3 on the substrate 210. The pixel defining layer 431 may be an insulating material including an inorganic material or an organic material, but is not limited thereto.

The pixel defining layer 431 may be the insulating material including the organic material. For example, the pixel defining layer 431 may include polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, silane based resin, and the like.

A first insulating layer 432a may be provided on the pixel defining layer 431. The first insulating layer 432a may cover a part of the upper surface of each of the LEDs LD1, LD2, and LD3 respectively provided in the first to third sub-pixels SP1, SP2, and SP3. Due to the first insulating layer 432a, a first end and a second end of each of the LEDs LD1, LD2, and LD3 may be exposed to the outside.

First and second electrodes E1 and E2 may be disposed on the protective layer 424. The first electrode E1 may include a first sub-electrode EL1 disposed adjacent to one end (e.g., a first semiconductor layer) of the corresponding LED LD and a first contact electrode CNE1 that electrically connects the first sub-electrode EL1 and one end of the LED LD. The second electrode E2 may include a second sub-electrode EL2 disposed adjacent to the other end (e.g., a second semiconductor layer) of the corresponding LED LD and a second contact electrode CNE2 that electrically connects the second sub-electrode EL2 and one end of the LED LD.

Accordingly, the driving voltage may be applied to the corresponding LED LD through the first electrode E1 and the voltage of the transistor TFT may be applied to the corresponding LED LD through the second electrode E2. As a result, a predetermined voltage may be applied to both ends of the LED LD through the first electrode E1 and the second electrode E2, and thus the LED LD may emit light. The wavelength of the emitted light may be different according to the concentration of In of the LED LD.

A second insulating layer 432b and a third insulating layer 432c may be provided on the first and second electrodes E1 and E2.

An overcoat layer 440 may be provided on the third insulating layer 432c. The overcoat layer 440 may be a planarization layer that alleviates the step caused by components disposed therebelow. Further, the overcoat layer 440 may be an encapsulation layer that prevents oxygen and moisture from penetrating into the LED LD.

Meanwhile, when the LEDs LD1, LD2, and LD3 of the respective sub-pixel SP1, SP2, and SP3 emit light of the same wavelength, the display device 1000 may further include a color conversion layer (not shown). The color conversion layer may include first to third color conversion patterns. Here, the first to third color conversion patterns may respectively correspond to sub-pixels. For example, the first color conversion pattern may correspond to the first sub-pixel SP1, the second color conversion pattern may correspond to the second sub-pixel SP2, and the third color conversion pattern may correspond to the third sub-pixel SP3.

Figure 15:
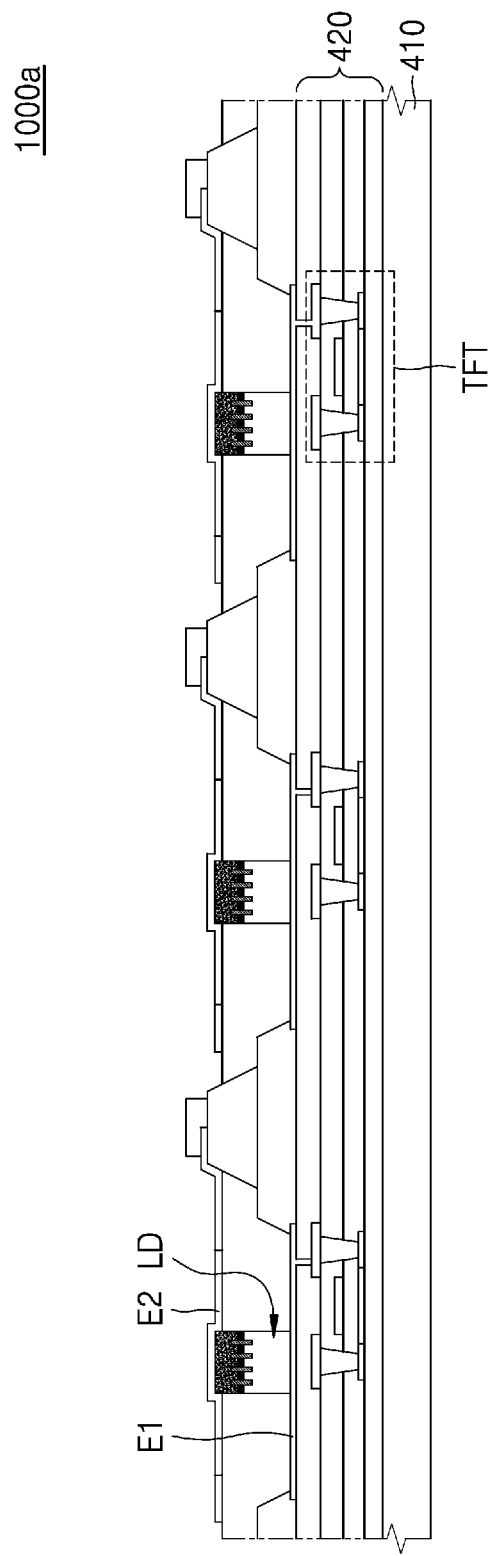
FIG. 15 is a diagram illustrating a part of a display device according to another embodiment.

FIG. 15 is a diagram illustrating a part of a display device according to another example embodiment. Upon comparing FIGS. 14 and 15, a first semiconductor layer, an active layer, and a second semiconductor layer of the LED LD shown in FIG. 15 may be arranged in parallel to the thickness direction of the substrate 410.

Figure 16:
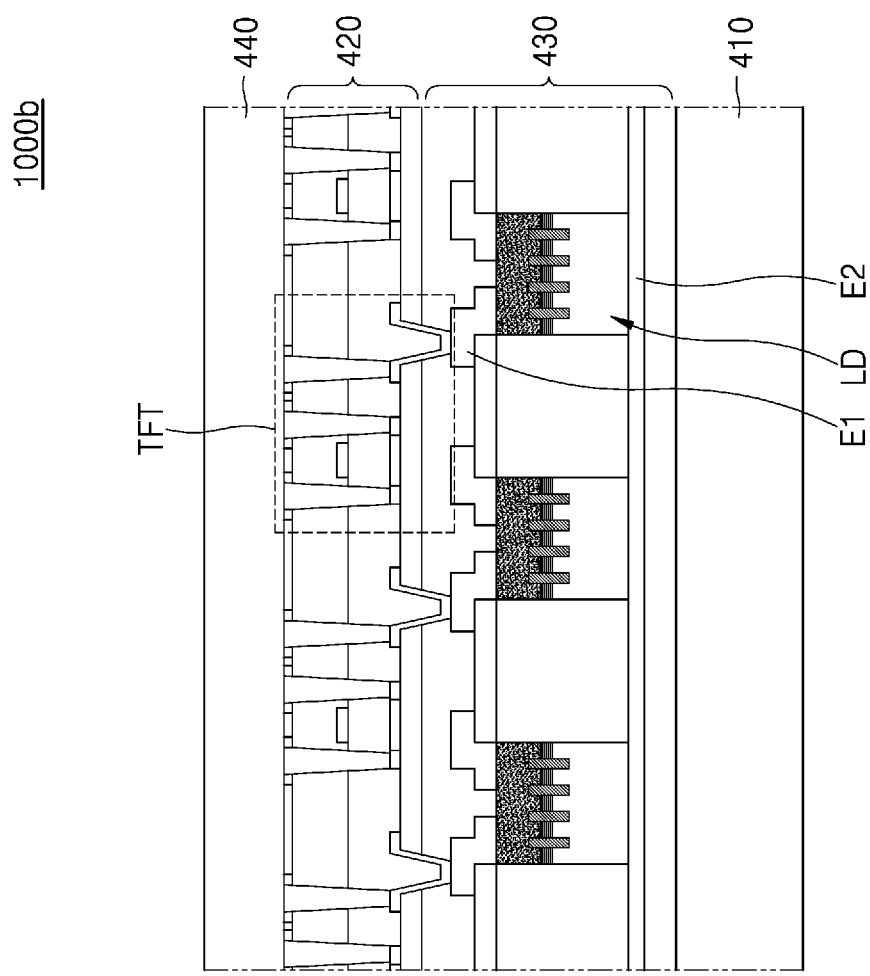
FIG. 16 is a diagram illustrating a part of a display device according to another embodiment.

FIG. 16 is a diagram illustrating a part of a display device according to another example embodiment. As shown in FIG. 16, the display element layer 430, the driving element layer 420, and the overcoat layer 440 may be sequentially arranged on the substrate 410. Upon comparing FIGS. 15 and 16, the display element layer 430 may be disposed between the substrate 410 and the driving element layer 420. The display device of FIG. 16 may monolithically and sequentially form the display element layer 430, the driving element layer 420, and the overcoat layer 440 on the substrate 410, and thus a manufacturing process may be simplified. In addition, the display device of FIG. 16 may be implemented as a bottom emission type by emitting light of different wavelengths in the LEDs LD.

The display device including the above-described LED may be employed in various electronic devices. For example, the display device may be applied to a television, a laptop, a mobile phone, a smart phone, a smart pad (PD), a PMP, a PDA, navigation, various wearable devices such as a smart watch, etc.

The LED, the manufacturing method thereof, and the display device have been described above with reference to the embodiments illustrated in the drawings but are only examples, and it will be apparent to those of ordinary skill in the art that various modifications may be made and other equivalent embodiments may be derived. While many matters have been described above in detail, they should be construed as illustrative of certain embodiments rather than limiting the scope of the present disclosure. Therefore, the scope of the present disclosure should be determined not by the example embodiments set forth herein but by the technical spirit described in the claims.

It should be understood that embodiments described herein should be considered in a descriptive sense only and not for purposes of limitation. Descriptions of features or aspects within each embodiment should typically be considered as available for other similar features or aspects in other example embodiments. While one or more embodiments have been described with reference to the figures, it will be understood by those of ordinary skill in the art that various changes in form and details may be made therein without departing from the spirit and scope as defined by the following claims.

What is claimed is:

1. A light emitting diode (LED) comprising:
   a first semiconductor layer;
   a plurality of active elements disposed on the first semiconductor layer, each of the plurality of active elements spaced apart from each other and having a width less than a width of the first semiconductor layer; and
   a second semiconductor layer disposed on the plurality of active elements and comprises a material different from that the first semiconductor layer,
   wherein the first semiconductor layer comprises a first semiconductor common layer and a plurality of first semiconductor elements respectively in contact with both the plurality of active elements and the first semiconductor common layer, the plurality of first semiconductor elements being spaced apart from each other,
   wherein the second semiconductor layer comprises a plurality of second semiconductor elements respectively in contact with the plurality of active elements, the plurality of second semiconductor elements being spaced apart from each other, and
   wherein the first semiconductor common layer and the plurality of first semiconductor elements are made of the same material.

2. The LED of claim 1, wherein the plurality of active elements are arranged in a direction parallel to a width direction of the first semiconductor layer.

3. The LED of claim 1, wherein a sum of widths of the plurality of active elements is less than a width of the first semiconductor layer.

4. The LED of claim 1, wherein each of the plurality of active elements is in a strain state.

5. The LED of claim 1, wherein a width of each of the plurality of active elements is greater than or equal to about 10 nm and less than or equal to about 100 nm.

6. The LED of claim 1, wherein a pitch between the plurality of active elements is greater than or equal to about 20 nm and less than or equal to about 300 nm.

7. The LED of claim 1, wherein the second semiconductor layer further comprises a second semiconductor common layer in contact with each of the plurality of second semiconductor elements.

8. The LED of claim 1, further comprising:
   an insulating layer disposed between the plurality of active elements.

9. The LED of claim 8, wherein the insulating layer comprises a mesh structure.

10. The LED of claim 1, wherein each of the plurality of active elements comprises $In_xGa_{1-x}N$ ($0 \leq x \leq 1$).

11. The LED of claim 10, wherein a content of In of each of the plurality of active elements is about 35% or more.

12. The LED of claim 1, wherein each of the plurality of active elements emits red light.

13. A display device comprising:
   a substrate;
   a display element layer disposed on the substrate and comprising a plurality of light emitting diodes (LEDs); and
   a driving element layer comprising a plurality of transistors electrically connected to the plurality of LEDs and configured to drive the plurality of LEDs,
   wherein at least one of the plurality of LEDs comprises:
      a first semiconductor layer;
      a plurality of active elements disposed on the first semiconductor layer, each of the plurality of active elements spaced apart from each other and having a width less than a width of the first semiconductor layer; and
      a second semiconductor layer disposed on the plurality of active elements and comprises a material different from that the first semiconductor layer,
   wherein the first semiconductor layer comprises a first semiconductor common layer and a plurality of first semiconductor elements respectively in contact with both the plurality of active elements and the first semiconductor common layer, the plurality of first semiconductor elements being spaced apart from each other,
   wherein the second semiconductor layer comprises a plurality of second semiconductor elements respectively in contact with the plurality of active elements, the plurality of second semiconductor elements being spaced apart from each other, and wherein the first semiconductor common layer and the plurality of first semiconductor elements are made of the same material.

14. The display device of claim 13, further comprising:
a first electrode in contact with the first semiconductor layer; and
a second electrode in contact with the second semiconductor layer.

15. The display device of claim 14, wherein the first electrode, the first semiconductor layer, the plurality of active elements, the second semiconductor layer, and the second electrode are sequentially arranged in a first direction.

16. The display device of claim 14, wherein the first electrode, the first semiconductor layer, the plurality of active elements, the second semiconductor layer, and the second electrode are arranged in a first direction perpendicular to a second direction, which is a thickness direction of the substrate.

17. The display device of claim 13, wherein the first electrode, the first semiconductor layer, the plurality of active elements, the second semiconductor layer, and the second electrode are arranged in a first direction parallel to a second direction, which is a thickness direction of the substrate.

18. The display device of claim 13, wherein each of the plurality of active elements is in a strain state.

19. The display device of claim 13, wherein a width of each of the plurality of active elements is greater than or equal to about 10 nm and less than or equal to about 100 nm.

20. The display device of claim 13, further comprising:
an insulating layer disposed between the plurality of active elements on the first semiconductor layer.

21. The display device of claim 20, wherein the insulating layer comprises a mesh structure.

22. The display device of claim 13, wherein each of the plurality of active elements comprises $In_xGa_{1-x}N$ ($0 \leq x \leq 1$).

23. The display device of claim 13, wherein each of the plurality of active elements emits red light.

* * * * *